(12) United States Patent
Kanehachi et al.

(10) Patent No.: US 7,496,169 B2
(45) Date of Patent: Feb. 24, 2009

(54) FREQUENCY SYNTHESIZER, PULSE TRAIN GENERATION APPARATUS AND PULSE TRAIN GENERATION METHOD

(75) Inventors: Kaoru Kanehachi, Tokyo (JP); Akira Toyama, Chigasaki (JP)

(73) Assignee: Nippon Precision Circuits Inc., Tokyo (JP)

( * ) Notice: Subject to any disclaimer, the term of this patent is extended or adjusted under 35 U.S.C. 154(b) by 613 days.

(21) Appl. No.: 11/224,803

(22) Filed: Sep. 13, 2005

(65) Prior Publication Data

US 2006/0056565 A1    Mar. 16, 2006

(30) Foreign Application Priority Data

Sep. 14, 2004    (JP)    ............................. 2004-299382
Dec. 17, 2004    (JP)    ............................. 2004-366712

(51) Int. Cl.
*H03D 3/24* (2006.01)

(52) U.S. Cl. ................. 375/376; 455/165.1; 455/183.1; 455/260; 455/271

(58) Field of Classification Search ................. 375/376; 455/65.1, 183.1, 260, 271, 165.1

See application file for complete search history.

(56) References Cited

U.S. PATENT DOCUMENTS

| 3,555,446 A | * | 1/1971 | Braymer | ...................... 331/16 |
| 3,582,810 A | * | 6/1971 | Gillette | ......................... 331/10 |
| 5,276,408 A | * | 1/1994 | Norimatsu | ...................... 331/8 |
| 5,521,556 A | * | 5/1996 | O'Shaughnessy et al. | ... 331/1 R |
| 5,914,682 A | * | 6/1999 | Noguchi | ...................... 341/145 |
| 6,114,890 A | * | 9/2000 | Okajima et al. | ............. 327/170 |
| 2003/0025565 A1 | * | 2/2003 | Takeda et al. | ............... 331/100 |
| 2005/0094757 A1 | * | 5/2005 | Meninger et al. | ........... 375/376 |

FOREIGN PATENT DOCUMENTS

| JP | 05-206732 | 8/1993 |
| JP | 05206732 A | * 8/1993 |

* cited by examiner

*Primary Examiner*—Juan A Torres
(74) *Attorney, Agent, or Firm*—Howard & Howard Attorneys PLLC

(57) ABSTRACT

A frequency synthesizer comprises a digital/analog converter which sequentially converts difference data of phase data indicating the phase of a reference signal to an analog value, a voltage signal generator which integrates the analog value converted by the digital/analog converter, thereby generating a voltage signal interpolating between signal levels corresponding to two time-sequential pieces of the phase data, a reference-timing-signal output section which outputs a reference timing signal indicating the specific phase of the reference signal at a timing when the signal level of the voltage signal generated by the voltage signal generator crosses a preset setting voltage, and a reset section which resets the voltage signal generated by the voltage signal generator to the setting voltage. Accordingly, the noise performance of an output signal from the frequency synthesizer is improved.

11 Claims, 14 Drawing Sheets

FREQUENCY SYNTHESIZER, PULSE TRAIN GENERATION APPARATUS AND PULSE TRAIN GENERATION METHOD

BACKGROUND OF THE INVENTION

1. Field of the Invention

The present invention relates to a frequency synthesizer which outputs a signal synchronized with a reference signal.

2. Description of the Related Art

There has been known a frequency synthesizer which uses a PLL (Phase Locked Loop) circuit to generate a signal synchronized with a reference signal. There is a digital frequency synthesizer which uses a DDS (Direct Digital Synthesizer). Such a synthesizer stores waveform data of trigonometric functions in a ROM (Read Only Memory), reads out the waveform data and performs D/A conversion on the waveform data, thereby generating a sine wave.

FIG. 11 illustrates the structure of a conventional frequency synthesizer which uses a DDS. As illustrated in FIG. 11, the conventional frequency synthesizer comprises an adder 26, a ROM 27, a D/A converter 28, an LPF (Low Pass Filter) 29, a comparator 9, and a PLL circuit 30. The adder 26, the ROM 27, the D/A converter 28, and the LPF 29 constitute a DDS circuit 200.

The conventional frequency synthesizer with the DDS illustrated in FIG. 11 first gives, as an input, the adder 26 a numerical value corresponding to a frequency to be generated. The adder 26 performs cumulative addition on the frequency data, and supplies the ROM 27 with a phase data string as an address. The ROM 27 acquires waveform data of a sine wave from the addresses sequentially designated by the phase data string, and supplies that waveform data to the D/A converter 28. The D/A converter 28 converts the received waveform data to an analog waveform, and supplies that analog waveform to the LPF 29. The analog output wave includes folded noise components and has a stepwise waveform. The LPF 29 supplies the comparator 9 a precise sinusoidal waveform obtained by eliminating the folded noise components. The comparator 9 compares the sinusoidal waveform supplied from the LPF 29 with a predetermined reference voltage, and supplies the PLL circuit 30 a pulse train indicating the polarity of the sinusoidal waveform with respect to the reference voltage. That is, the comparator 9 outputs the pulse train which specifies a phase at a transition point of the polarity of the sinusoidal waveform with respect to the reference voltage. The PLL circuit 30 outputs an output signal which is synchronized with the pulse train, and has a frequency equal to an integral-multiplied frequency of the pulse train. To improve the noise performance of the signal finally output from the PLL circuit 30 by that system, it is necessary to reduce the frequency multiplication by the PLL circuit 30 as small as possible. To that end, it is necessary to increase the frequency of the sine wave synthesized by the DDS circuit 200 as much as possible. The DDS circuit 200, however, requires the high-order and complex LPF 29 to eliminate folded spectrums if the frequency to be synthesized is not sufficiently low with respect to the operating frequency of the circuit. Even if an attempt is made to set the operating frequency of the circuit high, it is impossible to set that operating frequency higher than the operation limit of the D/A converter 28. Because of those reasons, there is a limitation to the frequency of the output signal of the DDS circuit 200.

There is another frequency synthesizer which uses waveform data of a triangular wave instead of sinusoidal waveform data, and performs linear interpolation to provide a signal synchronized with the reference signal without a ROM (see, for example, P3-4, and FIG. 1 of Unexamined Japanese Patent Application KOKAI Publication No. 05-206732).

The linear-interpolation type frequency synthesizer requires no ROM, and generates no folded spectrum. Accordingly, the frequency synthesizer does not require a filter for eliminating a folded spectrum.

The conventional linear-interpolation type frequency synthesizer, however, requires adjustment of the gain of the integrator which constitutes the linear interpolation circuit in accordance with the operating frequency of the circuit. If there is an error in that adjustment, the linear interpolation is not carried out precisely, resulting in generation of jitters in the output pulse train.

An offset error may be observed on the D/A converter included in the reference signal generator. Because of the offset error, the zero cross timing of the output voltage is shifted from the zero cross timing in a case where there is no offset error (ideal value). The shift of the zero cross timing becomes larger as time elapses from the reset timing. In general, the linear interpolation circuit is reset in synchronization with the system clock. Because the relative positions of the system clock and the zero cross timing always change, the time interval between the reset timing and the zero cross timing always changes, too.

Accordingly, there is a change in time lag between the zero cross timing obtained in a case where the D/A converter has the offset error, and the normal zero cross timing (without an offset error). This results in generation of jitters in the output pulse train.

FIG. 12A illustrates a VCO (Voltage Controlled Oscillator) control voltage of the PLL circuit which is controlled based on the reference timing signal, shown in FIG. 12B, that is the output pulse train with the jitters originated from the offset error of the D/A converter. As illustrated in FIGS. 12A and 12B, the VCO control voltage changes in accordance with the reference timing signal.

In response to that change, the frequency of the output signal changes. FIG. 13 illustrates the result of simulation of the frequency change characteristic when that frequency changes. The conditions of the simulation are the phase comparison frequency of 8051 kHz, the frequency division of the frequency of the PLL circuit by a division factor of 50, the 0.3% offset error of the D/A converter, and the secondary distortion of 0.3%. The range of the frequency change is 213 kHz at a period of 2.9 µs. The characteristic of the frequency spectrums becomes like one as illustrated in FIG. 14, and the frequency characteristic includes jamming (noise; spurious noise) spectrums, thereby deteriorating the frequency characteristic (noise performance).

In the conventional frequency synthesizer with the DDS, if the D/A converter has a non-linear offset error, noise spectrums due to the high-frequency distortion are generated. The noise spectrums, however, can be eliminated by narrowing the bandwidth of an analog filter (the LPF 29 in FIG. 11) which eliminates folded noise components.

The frequency synthesizer using triangular waveform data cannot use such an analog filter. Accordingly, the nonlinear characteristic of an analog signal due to the offset error of the D/A converter cannot be adjusted. Therefore, the frequency synthesizer requires a high precision D/A converter.

SUMMARY OF THE INVENTION

The present invention has been made in view of such conventional problems, and it is an object of the invention to provide a frequency synthesizer which can improve a frequency characteristic (noise performance) and a reference-signal-phase setting method for the synthesizer.

To attain the object, a frequency synthesizer according to the first aspect of the invention is a frequency synthesizer which outputs a synchronization signal synchronized with a phase of a reference signal, and comprises:

a digital/analog converter which sequentially converts difference data of phase data indicating the phase of the reference signal to an analog value;

a voltage signal generator which integrates the analog value converted by the digital/analog converter, thereby generating a voltage signal interpolating between signal levels corresponding to two time-sequential pieces of the phase data;

a reference-timing-signal output section which outputs a reference timing signal indicating a specific phase of the reference signal at a timing when a signal level of the voltage signal generated by the voltage signal generator crosses a preset setting voltage; and a reset section which resets the voltage signal generated by the voltage signal generator to the setting voltage.

The frequency synthesizer may further comprise:

a phase comparator which compares an output timing of the reference timing signal output from the reference-timing-signal output section with an output timing of a comparison timing signal generated based on the synchronization signal and outputs a phase difference signal indicating a difference between the output timings of both signals in signal level; and a synchronization signal generator which adjusts and sets a frequency based on the signal level of the phase difference signal output from the phase comparator, and generates the synchronization signal with the adjusted and set frequency.

The frequency synthesizer may further comprise a detector which detects a cross timing when the phase data changes over the setting voltage, wherein the reset section resets the voltage signal upon detection of the cross timing by the detector.

The frequency synthesizer may further comprise a reset controller which outputs a reset signal for allowing the reset section to reset the voltage signal only for a predetermined period from the output timing of the reference timing signal based on the reference timing signal, and wherein the reset section resets the voltage signal in response to the reset signal from the reset controller.

The frequency synthesizer may further comprise:

a counter section which frequency-divides the synchronization signal by a division factor of N and outputs a frequency division signal;

a timing setting section which delays the frequency division signal by a predetermined time and supplies the delayed signal as the comparison timing signal to the phase comparator; and a reset controller which resets the voltage signal in response to the reference timing signal, and cancels resetting of the voltage signal based on the frequency division signal.

A pulse train generation apparatus according to the second aspect of the invention is a pulse train generation apparatus which generates a pulse train to be a reference timing signal for a PLL circuit, and comprises:

a digital/analog converter which sequentially converts difference data of phase data indicating a phase of the reference signal to an analog value;

a voltage signal generator which integrates the analog value converted by the digital/analog converter, thereby generating a voltage signal interpolating between signal levels corresponding to two time-sequential pieces of the phase data;

a reference-timing-signal output section which outputs a reference timing signal indicating a specific phase of the reference signal at a timing when a signal level of the voltage signal generated by the voltage signal generator crosses a preset setting voltage; and a reset section which resets the voltage signal generated by the voltage signal generator to the setting voltage.

The pulse train generation apparatus may further comprise a reset controller which outputs a reset signal for allowing the reset section to reset the voltage signal only for a predetermined period from the output timing of the reference timing signal, and wherein the reset section resets the voltage signal in response to the reset signal from the reset controller.

The pulse train generation apparatus may further comprise a reset controller which resets the voltage signal in response to the reference timing signal output from the reset controller, and cancels resetting of the voltage signal based on a frequency division signal supplied from the PLL circuit.

A pulse train generation method according to the third aspect of the invention is a pulse train generation method which comprises:

a D/A conversion step of sequentially sampling and holding phase data $A0$ immediately before a point of prediction that a voltage signal, which interpolates between continuous phase data among a phase data string of a reference signal synchronized with a clock, crosses a preset setting voltage, and a difference $A1-A0$ between phase data $A1$ immediately after the point of prediction and the phase data $A0$ immediately before the point of prediction, and converting a sampled and held value to an analog value;

an integral step of generating the voltage signal proportional to an integral value obtained by integration of the analog value;

a signal output step of outputting a reference timing signal as a pulse train signal indicating a specific phase of the reference signal at a timing when the voltage signal crosses the setting voltage; and a reset step of resetting the voltage signal in such a way that the voltage signal becomes the setting voltage after outputting the reference timing signal.

The pulse train generation method may further comprise:

a phase calculation step of calculating the phase data string synchronized with the clock;

a detection step of detecting a predicted cross timing based on the phase data string; and a binary signal output step of comparing a signal level of the voltage signal with a signal level of the setting voltage and outputting a binary signal for generating the reference timing signal, based on a comparison result.

The reset step may cancel resetting of said voltage signal at a timing delayed by a predetermined time from a timing of resetting said voltage signal.

BRIEF DESCRIPTION OF THE DRAWINGS

These objects and other objects and advantages of the present invention will become more apparent upon reading of the following detailed description and the accompanying drawings in which.

DETAILED DESCRIPTION OF THE PREFERRED EMBODIMENTS

Figure 1:
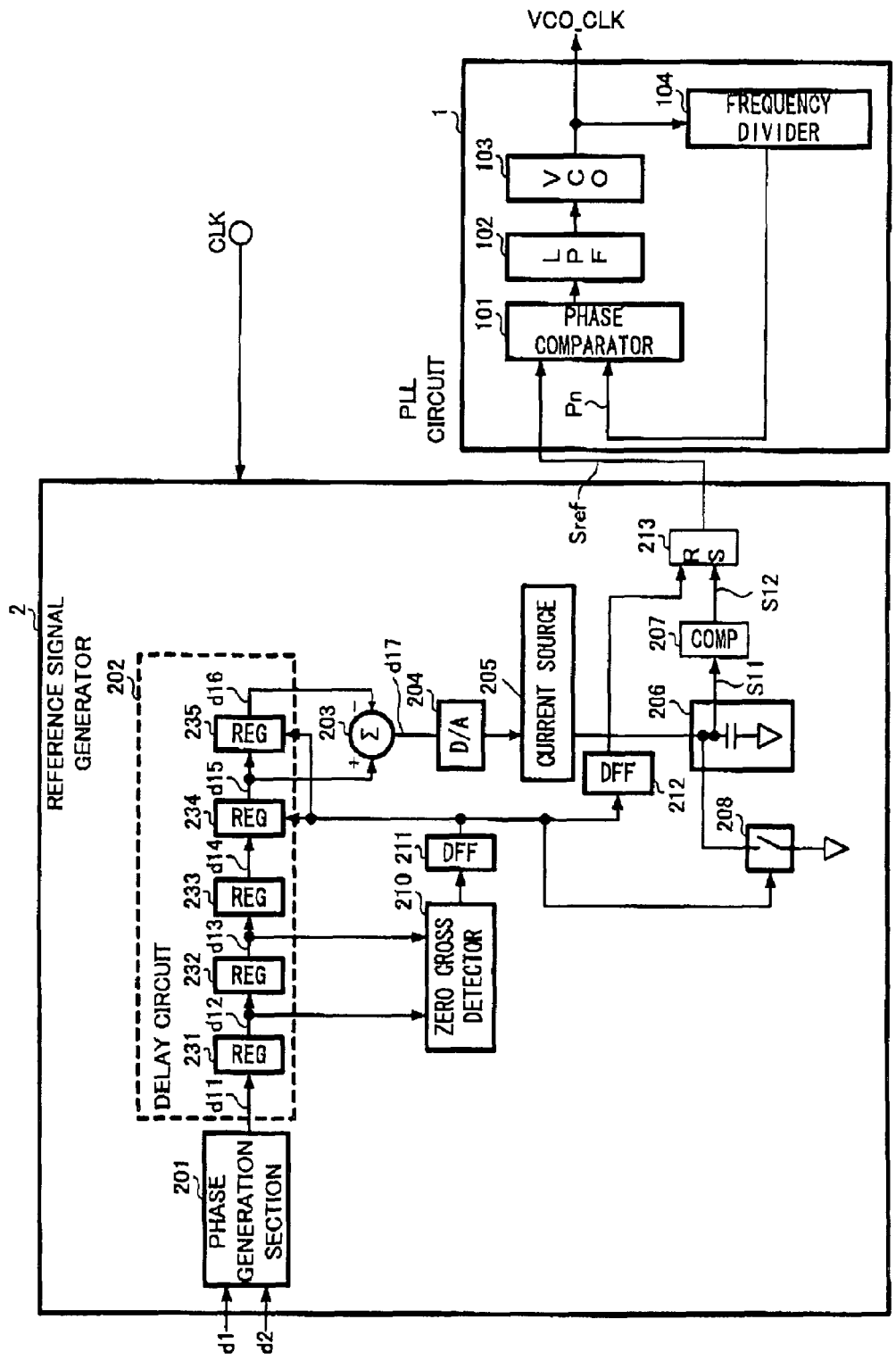
FIG. 1 is a block diagram illustrating the structure of a first embodiment of a frequency synthesizer according to the invention.

As illustrated in FIG. 1, a frequency synthesizer according to a first embodiment of the invention comprises a PLL circuit 1, and a reference signal generator 2.

The PLL circuit 1 generates a synchronized clock (clock signal) VCO_CLK whose phase is synchronized with the phase of a reference signal Sref generated by the reference signal generator 2. The PLL circuit 1 comprises a phase comparator 101, an LPF (Low Pass Filter) 102, a VCO 103, and a frequency divider 104.

The phase comparator 101 compares the phase of the reference signal Sref output from the reference signal generator 2 with the phase of a comparison timing signal Pn output from the frequency divider 104, and generates a phase difference signal representing the difference in phases between the signals. More specifically, the phase comparator 101 compares the output timing of the reference signal Sref output from the reference signal generator 2 with the output timing of the comparison timing signal output from the frequency divider 104, and generates the phase difference signal which indicates the difference between the output timings of those signals by signal level.

The LPF 102 eliminates (attenuates) high-frequency components of the phase difference signal generated by the phase comparator 101 which is higher than a preset cutoff frequency.

The VCO 103 receives the phase difference signal whose high-frequency components are eliminated by the LPF 102, and generates the clock signal VCO_CLK of a frequency $f_{out}$ determined based on the signal level of the phase difference signal. The frequency synthesizer outputs the clock VCO_CLK generated by the VCO 103.

The frequency divider 104 comprises a counter which counts the clock VCO_CLK output from the VCO 103, and outputs a pulse signal (comparison timing signal) Pn every time when counting N of that clocks. That is, the frequency divider 104 frequency-divides the clock VCO_CLK by a division factor of N. The frequency of the pulse signal Pn is 1/N of that of the clock VCO_CLK. The frequency divider 104 supplies the phase comparator 101 the generated pulse signal Pn as the comparison timing signal.

The reference signal generator 2 operates in synchronization with a supplied system clock CLK, and generates the reference signal Sref to be supplied to the PLL circuit 1. The reference signal generator 2 comprises a phase generation section 201, a delay circuit 202, a subtractor 203, a D/A converter 204, a current source 205, a linear interpolation circuit 206, a comparator 207, a reset section 208, a zero cross detector 210, a DFF 211, a DFF 212, and an RS flip-flop 213.

Figure 2:
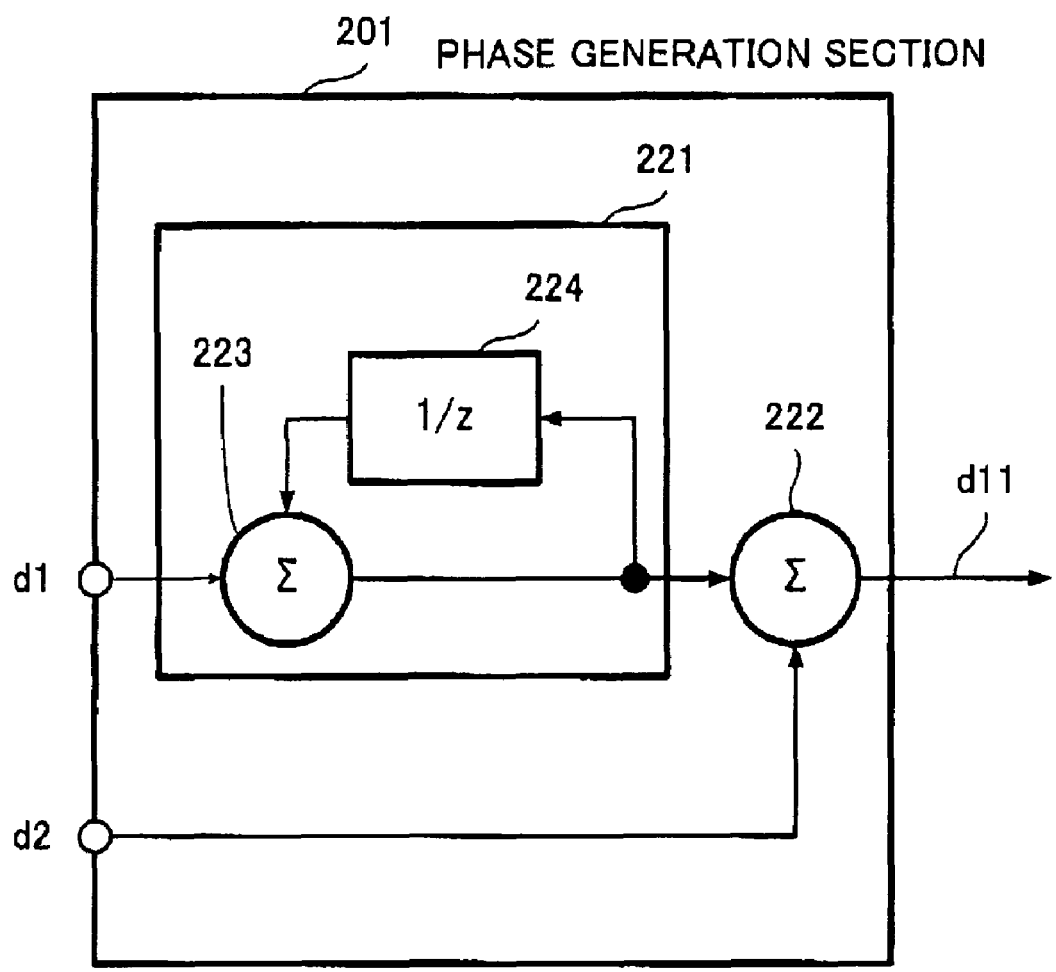
FIG. 2 is a block diagram illustrating the structure of a phase generation section.

As illustrated in FIG. 2, the phase generation section 201 is supplied with frequency data d1 and modulation data d2, and generates phase data for generating the reference signal Sref in synchronization with the system clock CLK. The phase generation section 201 comprises a phase accumulator 221 and an adder 222.

The phase accumulator 221 integrates the supplied frequency data d1, and comprises an adder 223 and a delay device 224 which delays the data output from the adder 223 by one system clock CLK.

The adder 223 adds the supplied frequency data d1 to output data of the delay device 224, and generates integral data. The delay device 224 supplies the adder 223 the integral data output from the adder 223.

The adder 223 has a preset number of bits, and the integral data overflows when it exceeds that number. The phase accumulator 221 invalidates excess bits, and outputs a preset number of lower bits. Accordingly, a waveform according to data output from the phase accumulator 221 becomes like a sawtooth waveform. The adder 222 generates phase data d11 based on the frequency data d1 and the modulation data d2. The phase generation section 201 supplies the delay circuit 202 a series of generated data d11 as a phase data string.

The delay circuit 202 delays the phase data d11 to allow a zero cross timing detected by the comparator 207 to correspond to the timing of inversion of the polarity of the phase data detected by the zero cross detector 210. The delay circuit 202 has registers 231 to 235 (each abbreviated as "REG" in the figures).

The registers 231 to 235 store the supplied phase data d11 to d15 in synchronization with the rise of the system clock CLK and output stored data as phase data d12 to d16 in synchronization with the next rise of the system clock CLK. The input terminal of the register 231 is connected to the output terminal of the adder 222 (the output terminal of the phase generation section 201), and the input terminals of the registers 232 to 235 are connected to the output terminals of the registers 231 to 234, respectively.

The subtractor 203 subtracts the phase data d16 output from the register 235 from the phase data d15 output from the register 234 to generate difference data d17. The subtractor 203 is connected between the output terminal, of the register 234 and that of the register 235. The subtractor 203 supplies the calculated difference data d17 to the D/A converter 204.

The D/A converter 204 converts the difference data d17 supplied from the subtractor 203 into an analog signal.

The current source 205 and the linear interpolation circuit 206 constitute an integrator (integration circuit).

The current source 205 supplies the linear interpolation circuit 206 with a current proportional to the analog signal converted by the D/A converter 204.

The linear interpolation circuit 206 comprises a capacitor which has one end connected to the current source 205 and the other end grounded. The linear interpolation circuit 206 integrates the current proportional to the analog signal to linearly interpolate a signal level corresponding to the phase data sequentially supplied in synchronization with the system clock CLK, and supplies a voltage signal S11.

The reset section 208 comprises a switch with one end grounded. The other end of the switch is connected to one end of the capacitor of the liner interpolation circuit 206. The reset section 208 is turned on/off in accordance with an output signal of the DFF 211 supplied to a control terminal thereof. When the reset section 208 is turned on, electric charges accumulated in the capacitor of the linear interpolation circuit 206 are discharged, thereby resetting the voltage of the signal S11 to a zero voltage.

The comparator 207 compares the voltage of the voltage signal S11 output from the linear interpolation circuit 206 with the preset zero voltage. The comparator 207 allows a reference timing signal S12 to go to a high level at a timing (zero cross timing) when the negative voltage of the voltage signal S11 increases so as to cross the zero voltage as the setting voltage. The reference timing signal S12 from the comparator 207 is supplied to a set terminal S of the RS flip-flop 213. The zero cross timing when the reference timing signal S12 of the comparator 207 goes to a high level indicates a specific phase with which the PLL should synchronize.

The zero cross detector 210 compares the phase data d12 with the phase data d13, and detects a change in the polarity of the phase data from negative to positive to predict the zero cross timing of the voltage signal S11. The zero cross detector 210 predicts the zero cross timing when the phase data d12 and d13 are respectively positive and negative. When detecting the zero cross timing, the zero cross detector 210 allows the output signal which is supplied to the DFF 211 to go to a high level.

The DFF 211 outputs a reset signal in synchronization with the next rise of the system clock CLK when the zero cross detector 210 detects the zero cross timing. The input terminal of the DFF 211 is connected to the output terminal of the zero cross detector 210, while the output terminal of the DFF 211 is connected to reset terminals of the registers 234 and 235, an input terminal of the DFF 212, and the control terminal of the reset section 208.

The DFF 212 outputs the output signal of the DFF 211 in synchronization with the next rise of the system clock CLK. The output signal of the DFF 212 is supplied to a reset terminal R of the RS flip-flop 213.

The RS flip-flop 213 sets an output signal to a high level when the reference timing signal S12 from the comparator 207 supplied to the set terminal S goes to a high level. The RS flip-flop 213 resets the output signal to a low level when the output signal of the DFF 212 supplied to the reset terminal R goes to a high level. The output signal of the RS flip-flop 213 is supplied to the PLL circuit 1 as the reference signal Sref which is the output signal of the reference signal generator 2.

Next, with reference to FIGS. 3A to 3J and 4A to 4G, an explanation will be given of the operation of the thus structured frequency synthesizer according to the first embodiment. FIGS. 3A to 3J show the waveforms of the system clock signal CLK, the phase data d11 output from the phase generation section 201, the phase data d12 output from the register 231, the phase data d13 output from the register 232, the phase data d14 output from register 233, the phase data d15 output from register 234, the phase data d16 output from register 235, the difference data d17 output from the subtractor 203, the output signal of zero cross detector 210 and the output signal of the DFF 211, respectively.

FIGS. 4A to 4G are timing charts for explaining the difference data d17 output from the subtractor 203, the voltage signal S11 output from the linear interpolation circuit 206, the reference timing signal S12 output from the comparator 207, the output signal of the DEF 212, the reference signal Sref output from the RS flip-flop 213, the clock signal VCO CLK output from the VCO 103 and the comparison timing signal Pn output from frequency divider 104, respectively.

Figure 3:
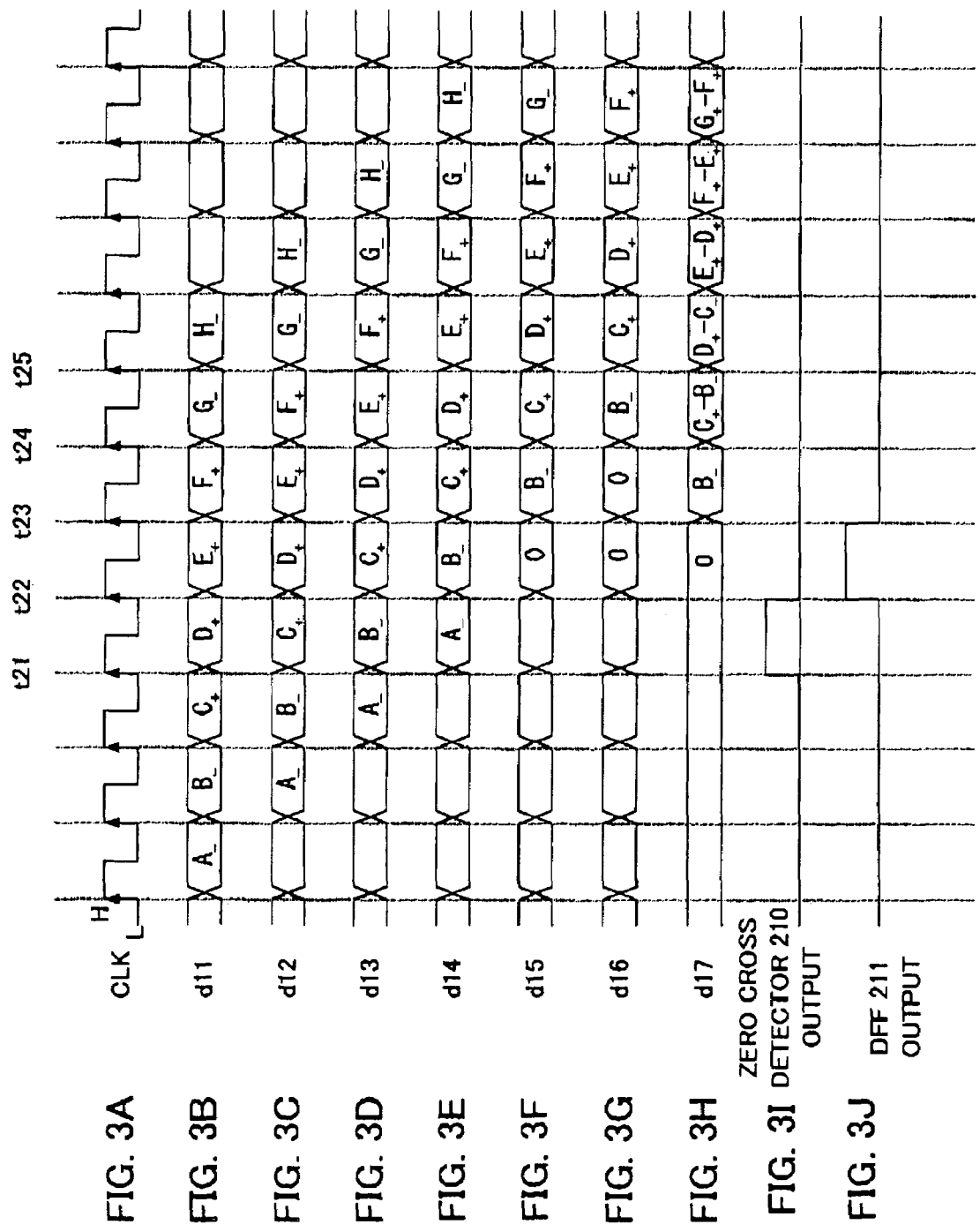
FIGS. 3A to 3J are timing charts for explaining the respective operations of the frequency synthesizer of the first to third embodiments.

The phase generation section 201 outputs a data string of the phase data d11 as illustrated in FIG. 3B to the delay circuit 202 in synchronization with the system clock CLK illustrated in FIG. 3A. The symbols "+" and "−" respectively represent the positive and negative polarities of the phase data.

At time t21, when the register 232 outputs the phase data $d13=B_-$ as illustrated in FIG. 3D, and the register 231 outputs the phase data $d12=C_+$ as shown in FIG. 3C, the zero cross detector 210 detects that the polarity of the phase data changes from negative to positive, and outputs a high level (outputs a signal with a high signal level) as illustrated in FIG. 3I.

At time t22, as illustrated in FIGS. 3A, 3I and 3J, the DFF 211 supplies the DFF 212 the high level signal supplied from the zero cross detector, in synchronization with the rise of the system clock CLK. The high level signal output from the DFF 211 resets the registers 234 and 235, and turns on the reset circuit 208 at the time t22. When the registers 234 and 235 are reset, the difference data d17 supplied to the D/A converter 204 becomes zero as illustrated in FIG. 3H.

At time t23, when the system clock CLK rises, the subtractor 203 subtracts the phase data $d16=0$ output from the register 235 from the phase data $d15=B_-$ output from the register 234, generates the difference data $d17=B_-$, and supplies that data d17 to the D/A converter 204 as illustrated in FIGS. 3A, 3F and 3G. The D/A converter 204 converts the difference data $d17=B_-$ illustrated in FIG. 4A into an analog signal. The current source 205 supplies the linear interpolation circuit 206 a current with a current value corresponding to that analog signal. Because data B is negative, the voltage of the voltage signal S11 of the linear interpolation circuit 206 drops and the comparator 207 sets the reference timing signal S12 at a low level as illustrated in FIGS. 4B and 4C.

Figure 4:
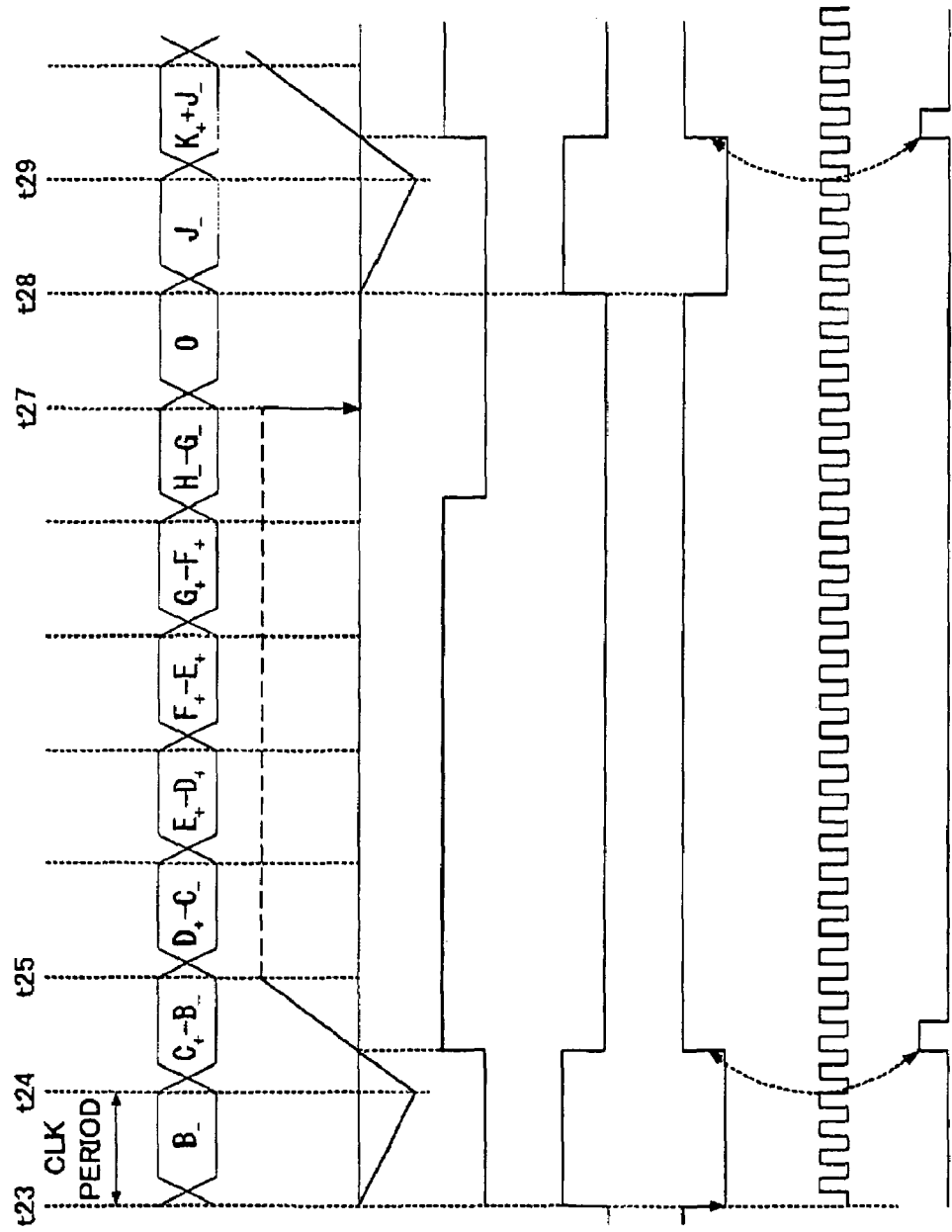
FIGS. 4A to 4G are timing charts for elaborating the operation of the frequency synthesizer of the first embodiment.

At the time t23, the DFF 212 supplies the reset terminal R of the RS flip-flop 213 the high level signal supplied from the DFF 211 as illustrated in FIG. 4D. Accordingly, the RS flip-flop 213 resets its output to a low level as illustrated in FIG. 4E.

As illustrated in FIGS. 3A to 3J, at time t24, when the system clock CLK rises, the subtractor 203 subtracts the phase data $d16=B_-$ output from the register 235 from the phase data $d15=C_+$ output from the register 234, and generates the difference data $d17=C_+-B_-$. The subtractor 203 supplies the D/A converter 204 the generated difference data D17. The D/A converter 204 converts the difference data $d17=C_+-B_-$ into an analog signal.

As illustrated in FIGS. 4A to 4G, at the time t24, the DFF 212 allows the signal to be supplied to the reset terminal R of the RS flip-flop 213 to go to a low level. The RS flip-flop 213 keeps its output at a low level.

As illustrated in FIGS. 4A to 4G, the current source 205 supplies the linear interpolation circuit 206 a current with a current value corresponding to the difference data $d17=C_+-B_-$. Because of the difference data $d17=C_+-B_->0$, the voltage of the signal S11 increases.

When the voltage of the voltage signal S11 exceeds the zero voltage, the comparator 207 supplies the set terminal S of the RS flip-flop 213 the high-level reference timing signal S12. Accordingly, the RS flip-flop 213 sets its output Sref at a high level as shown in FIG. 4C.

The reference signal Sref output from the RS flip-flop 213 shown in FIG. 4E indicates a specific phase and is supplied to the phase comparator 101 of the PLL circuit 1.

The PLL circuit 1 receives the reference signal Sref, and, by the following operation, generates the clock VCO_CLK synchronized with the reference signal Sref.

The frequency divider 104 outputs the pulse signal (comparison timing signal) Pn to the phase comparator 101 when counting N clocks of the clock VCO_CLK as illustrated in FIGS. 4F and 4G.

The phase comparator 101 compares a rise timing of the reference signal supplied from the reference signal generator 2 (the output signal of the RS flip flop circuit 213) with a rise timing of the signal Pn supplied from the frequency divider 104. The phase comparator 101 outputs the phase difference signal indicative of the timing difference between those signals to the LPF 102. If the phase of the reference signal Sref shown in FIG. 4E is ahead of the phase of the pulse signal Pn shown in FIG. 4G, the phase comparator 101 outputs the LPF 102 the phase difference signal which increases a VCO oscillating frequency so as to allow the phase of the pulse signal Pn to advance.

If the phase of the pulse signal Pn shown in FIG. 4G is ahead of the phase of the reference signal Sref shown in FIG. 4E, the phase comparator 101 outputs the LPF 102 the phase difference signal which decreases the VCO oscillating frequency so as to delay the phase of the pulse signal Pn. The LPF 102 eliminates high-frequency components higher than the cutoff frequency of the phase difference signal output from the phase comparator 101.

The VCO 103 sets the oscillating frequency $f_{out}$ of it based on the phase difference indicated by the phase difference signal, and outputs the clock VCO_CLK.

To change the operating frequency (the frequency of the system clock CLK) of the frequency synthesizer structured in such a way, it is necessary to change the gain (rate of conversion from an analog signal into a current value) of the integrator constituted by the current source 205 and the linear interpolation circuit 206, in response to the change in the operating frequency. The zero cross timing in the frequency synthesizer according to the embodiment is defined only by phase data immediately before or after the polarity inverts. Accordingly, even if there is an error in the setting of the gain, the constant zero cross timing can be obtained, thereby improving the frequency characteristic (noise performance) of the clock VCO_CLK output from the PLL circuit 1.

Second Embodiment

Next, a second embodiment of the frequency synthesizer according to the invention will be explained. The frequency synthesizer of the embodiment can suppress a noise originated from an offset error even if the D/A converter 204 has the offset error.

Figure 5:
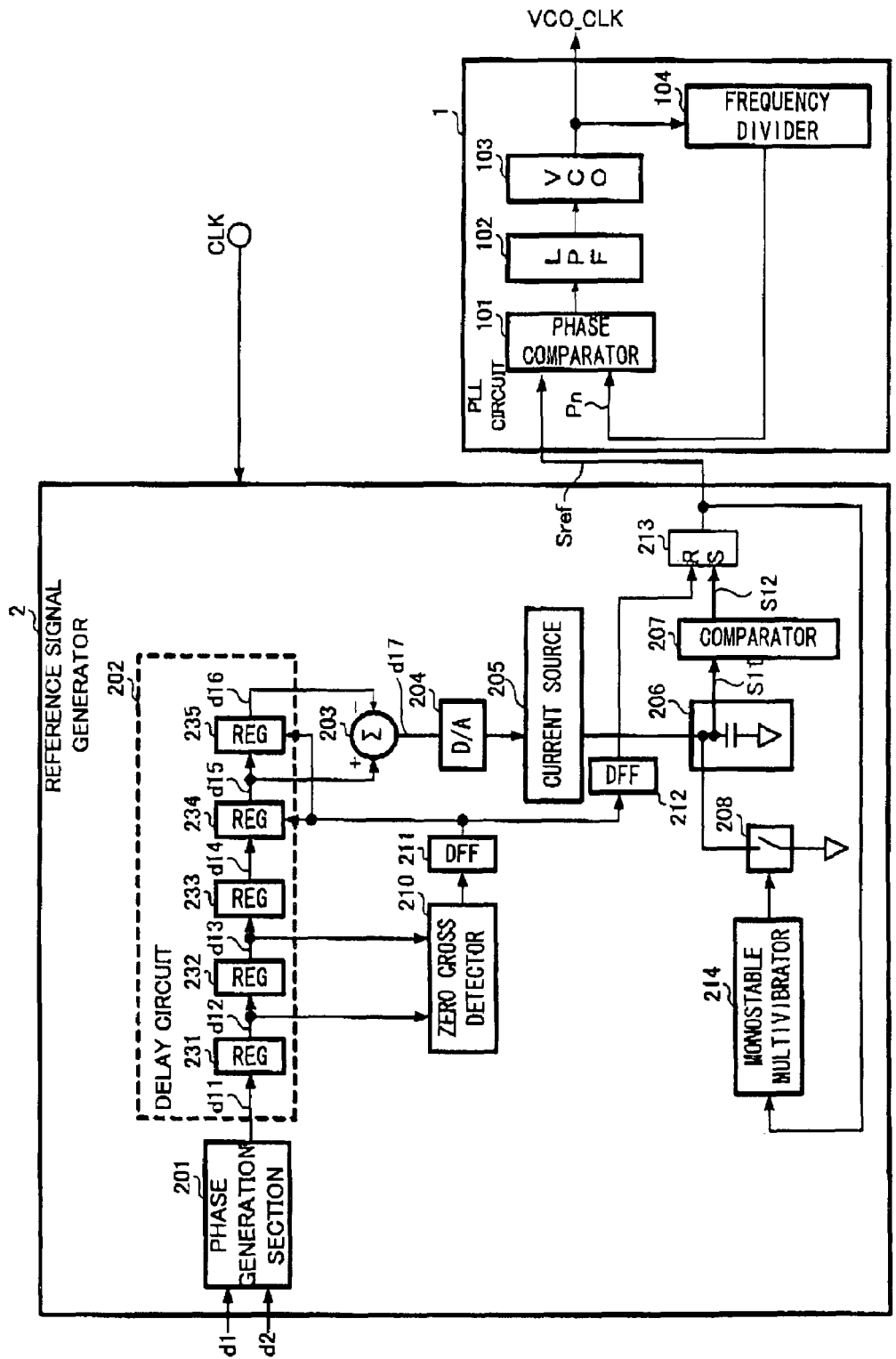
FIG. 5 is a block diagram illustrating the structure of a frequency synthesizer according to the second embodiment of the invention.

As illustrated in FIG. 5, like the frequency synthesizer in the first embodiment, the frequency synthesizer of the embodiment comprises the PLL circuit 1 and the reference signal generator 2.

The PLL circuit 1 generates a synchronization signal whose phase is synchronized with the phase of the reference signal generated by the reference signal generator 2. The PLL circuit 1 comprises the phase comparator 101, the LPF 102, the VCO 103, and the frequency divider 104. Because the functions and the operations of the individual components of the PLL circuit 1 are the same as those of the PLL circuit in the first embodiment, their explanations will be omitted.

The reference signal generator 2 in the embodiment operates in synchronization with the supplied system clock CLK, and generates the reference timing signal to be supplied to the PLL circuit 1. The reference signal generator 2 comprises the phase generation section 201, the delay circuit 202, the subtractor 203, the D/A converter 204, the current source 205, the linear interpolation circuit 206, the comparator 207, the reset section 208, the zero cross detector 210, the DFF 211, the DFF 212, the RS flip-flop 213, and a monostable multivibrator 214.

Because the functions and the connection relationship of the individual components of the reference signal generator 2 of the embodiment are basically the same as those of the reference signal generator 2 in the first embodiment, only the differences from the first embodiment will be explained below.

The reset section 208 of the embodiment is turned on/off in accordance with an output signal of the monostable multivibrator 214 supplied to the control terminal. When the reset section 208 is turned on, the electric charges accumulated in the capacitor of the linear interpolation circuit 206 are discharged, thereby resetting the voltage of the signal S11 to a zero voltage.

The DFF 211 outputs the reset signal in synchronization with the next rise of the system clock CLK when the zero cross detector 210 detects the zero cross timing. The input terminal of the DFF 211 is connected to the output terminal of the zero cross detector 210, while the output terminal of the DFF 211 is connected to the reset terminals of the registers 234 and 235, and the input terminal of the DFF 212.

The DFF 212 outputs the output signal of the DFF 211 in synchronization with the next rise of the system clock CLK. The output signal of the DFF 212 is supplied to the reset terminal R of the RS flip-flop 213.

The RS flip-flop 213 sets the reference signal Sref at a high level when the reference timing signal S12 from the comparator 207 supplied to the set terminal S goes to a high level. The RS flip-flop 213 resets the reference signal Sref to a low level when the output signal of the DFF 212 supplied to the reset terminal R goes to a high level. The reference signal Sref of the RS flip-flop 213 is supplied to the PLL circuit 1. The reference signal Sref is the output signal of the reference signal generator 2. The reference signal Sref from the RS flip-flop 213 is also supplied to the monostable multivibrator 214 as a trigger pulse.

The monostable multivibrator 214 generates a reset signal with a predetermined pulse width at a timing when the reference signal Sref from the RS flip-flop 213 goes to a high level. The reset signal generated by the monostable multivibrator 214 is supplied to the control terminal of the reset section 208.

Next, with reference to FIGS. 3A to 3J and 6A to 6G, an explanation will be given of the operation of the thus structured frequency synthesizer according to the second embodiment. FIGS. 6A to 6G are time charts for explaining the difference data d17 output from the subtracter 203, the voltage signal S11 output from the linear interpolation circuit 206, the reference timing signal S12 output from the comparator 207, the reference signal Sref output from RS flip-flop 213, the output signal of the monostable multivibrator 214, the clock signal VCO CLK output from the VCO 103, and the comparison timing signal (pulse signal) Pn output from frequency divider 104, respectively.

As same as the first embodiment, the phase generation section 201 outputs a data string of the phase data d11 as illustrated in FIG. 3B to the delay circuit 202 in synchronization with the system clock CLK. The symbols "+" and "−" respectively represent the positive and negative polarities of the phase data d11 to d16.

At the time t21, when the register 232 outputs the phase data d13=B_, and the register 231 outputs the phase data d12=C_+, the zero cross detector 210 detects that the polarity of the phase data changes from negative to positive, and outputs a high level as shown in FIGS. 3A, 3C and 3D.

At the time t22, the DFF 211 supplies the DFF 212 the high level supplied from the zero cross detector 210, in synchronization with the rise of the system clock CLK as shown in FIGS. 3A, 3I, and 3J. The reset signal output from DFF 211 resets the registers 234 and 235, and turns on the reset circuit 208 at the time t22. When the registers 234 and 235 are reset, the difference data d17 to be supplied to the D/A converter 204 becomes zero as shown in FIGS. 3H and 3J.

Figure 6:
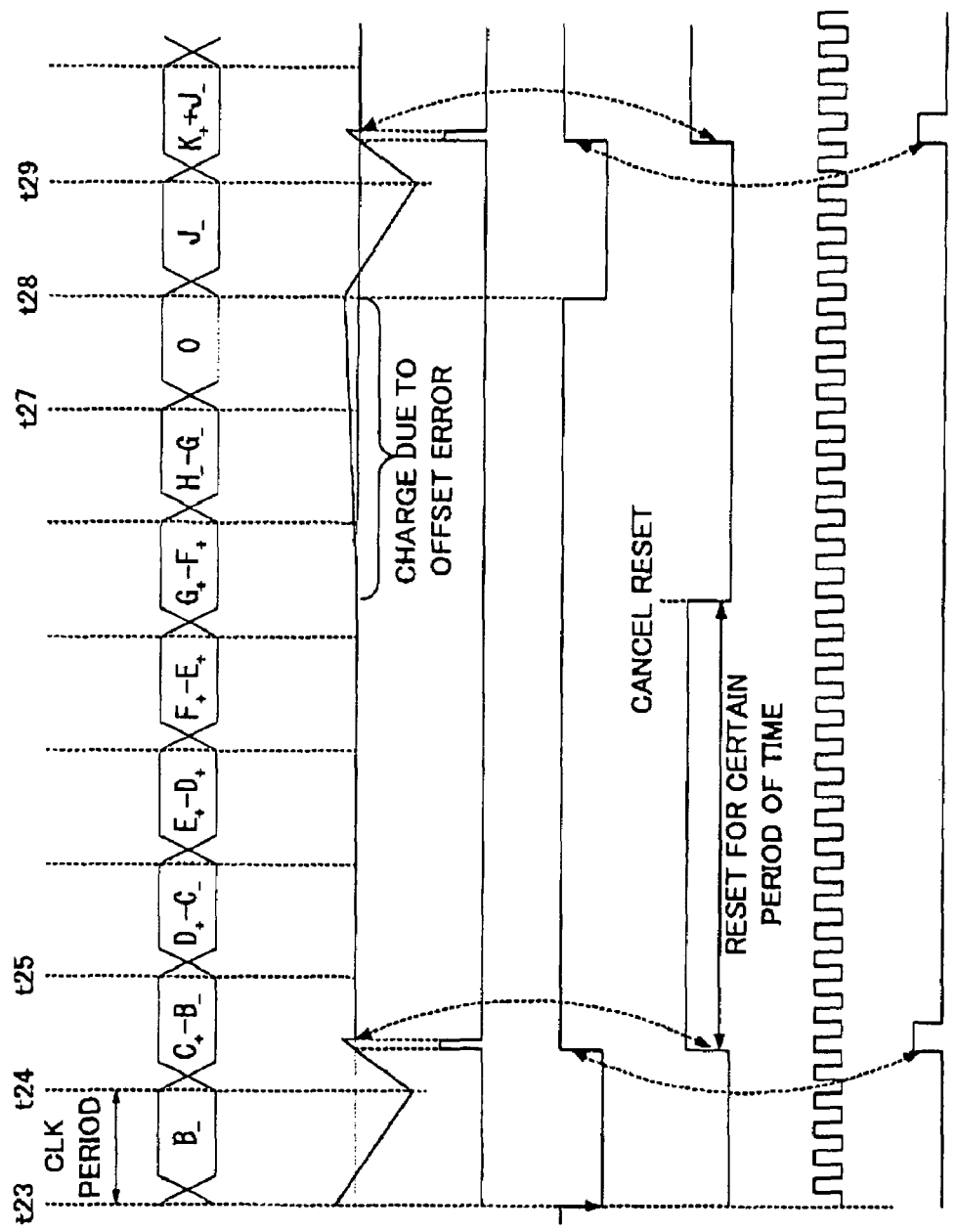
FIGS. 6A to 6G are timing charts for explaining the operation of the frequency synthesizer of the second embodiment in detail.

At the time t23, when the system clock CLK rises up, the subtracter 203 subtracts the phase data d16=0 output from the register 235 from the phase data d15=B_ output from the register 234, and generates the difference data d17=B_ as shown in FIGS. 3F to 3H. The subtracter 203 supplies the generated difference data d17 to the D/A converter 204. The D/A converter 204 converts the difference data d17=B_ into an analog signal. As illustrated in FIG. 6A and 6B, the current source 205 supplies the linear interpolation circuit 206 a current with a current value corresponding to that analog signal. Because data B is negative, the voltage of the voltage signal S11 of the linear interpolation circuit 206 drops.

It is supposed that before the time t23, the linear interpolation circuit 206 is reset by the reset section 208 which has received the reset signal from the monostable multivibrator 214, and then the reset is cancelled. It is also supposed that the linear interpolation circuit 206 is charged by the offset error of the D/A converter 204, and the output voltage is shifted from 0 V.

At the time t23, the DFF 212 supplies the reset terminal R of the RS flip-flop 213 the high level supplied from the DFF 211. Accordingly, the RS flip-flop 213 resets its output to a low level.

As illustrated in FIGS. 3A to 3J, at the time t24, when the system clock CLK rises, the subtracter 203 subtracts the phase data d16=B_ output from the register 235 from the phase data d15=C_+ output from the register 234, generates the difference data d17=C_+−B_, and supplies that generated difference data d17 to the D/A converter 204. The D/A converter 204 converts the difference data d17=C_+−B_ into an analog signal.

At the time t24, the DFF 212 sets the signal supplied to the reset terminal R of the RS flip-flop 213 at a low level. The RS flip-flop 213 keeps its output Sref at a low level.

As illustrated in FIGS. 6A to 6G, the current source 205 supplies the linear interpolation circuit 206 a current with a current value corresponding to the difference data d17=C_+−B_. Because of the difference data d17=C_+−B_>0, the voltage of the voltage signal S11 increases.

When the voltage of the voltage signal S11 exceeds the zero voltage, the comparator 207 supplies the set terminal S of the RS flip-flop 213 the high-level signal S12. Accordingly, the RS flip-flop 213 sets its output Sref at a high level.

The output signal of the RS flip-flop 213 which indicates a specific phase is supplied to the phase comparator 101 of the PLL circuit 1.

When the output signal i.e., the reference signal Sref from the RS flip-flop 213 goes to a high level, the monostable multivibrator 214 supplies the reset section 208 the reset signal with a predetermined pulse width. Accordingly, the reset section 208 is turned on, and the linear interpolation circuit 206 is reset. The pulse width of the reset signal is set in such a way that the reset is cancelled before the next zero cross timing. As illustrated in FIGS. 6A to 6G, when the reset is cancelled, the linear interpolation circuit 206 is charged by the offset error of the D/A converter 204.

The PLL circuit 1 receives such a reference signal Sref, and, by the following operation, generates the clock VCO_CLK synchronized with the reference signal Sref.

The frequency divider 104 outputs the pulse signal Pn to the phase comparator 101 when counting N clocks of the clock VCO_CLK.

The phase comparator 101 compares a rise timing of the reference signal Sref supplied from the reference signal generator 2 with a rise timing of the pulse signal Pn. After the comparison, the phase comparator 101 outputs the LPF 102 the phase difference signal indicative of the timing difference between those signals. If the phase of the reference signal Sref is ahead of the phase of the pulse signal Pn, the phase comparator 101 outputs the LPF 102 the phase difference signal which increases a VCO oscillating frequency so as to allow the phase of the pulse signal Pn to advance.

If the phase of the pulse signal Pn is ahead of the phase of the reference signal Sref, the phase comparator 101 outputs the LPF 102 the phase difference signal which decreases the VCO oscillating frequency so as to delay the phase of the pulse signal Pn. The LPF 102 eliminates a high-frequency component higher than the cutoff frequency of the phase difference signal output from the phase comparator 101.

The VCO 103 sets the frequency $f_{out}$ based on the phase difference indicated by the phase difference signal, and outputs the clock VCO_CLK.

In general, in the linear interpolation type frequency synthesizer, when the D/A converter 204 has an offset error, even if the data to be supplied is zero, the output of the D/A converter 204 is shifted from zero. Accordingly, during the cancellation of the resetting of the linear interpolation circuit 206, the current due to that error keeps charging the capacitor of the linear interpolation circuit 206. Therefore, the zero cross timing when the D/A converter 204 has the offset error is shifted from that in an ideal case where the D/A converter 204 does not have the offset error. Because the timing when the resetting of the linear interpolation circuit 206 is not constant, the shift of the zero cross timing is not constant. This results in generation of jitters in the clock VCO_CLK output from the PLL circuit 1.

In contrast, in the frequency synthesizer of the embodiment, the monostable multivibrator 214 resets the linear interpolation circuit 206 by a predetermined period from the timing when the reference signal Sref from the RS flip-flop 213 goes to a high level. Accordingly, the shift associated with the offset error becomes constant, and the shift of the zero cross timing also becomes constant. As a result, the frequency synthesizer of the embodiment can suppress the frequency change titters) in the clock VCO_CLK output from the PLL circuit 1.

Third Embodiment

Next, a third embodiment of the frequency synthesizer according to the invention will be explained. The frequency synthesizer of the embodiment can suppress a noise originated from an offset error even if the D/A converter 204 has the offset error.

Figure 7:
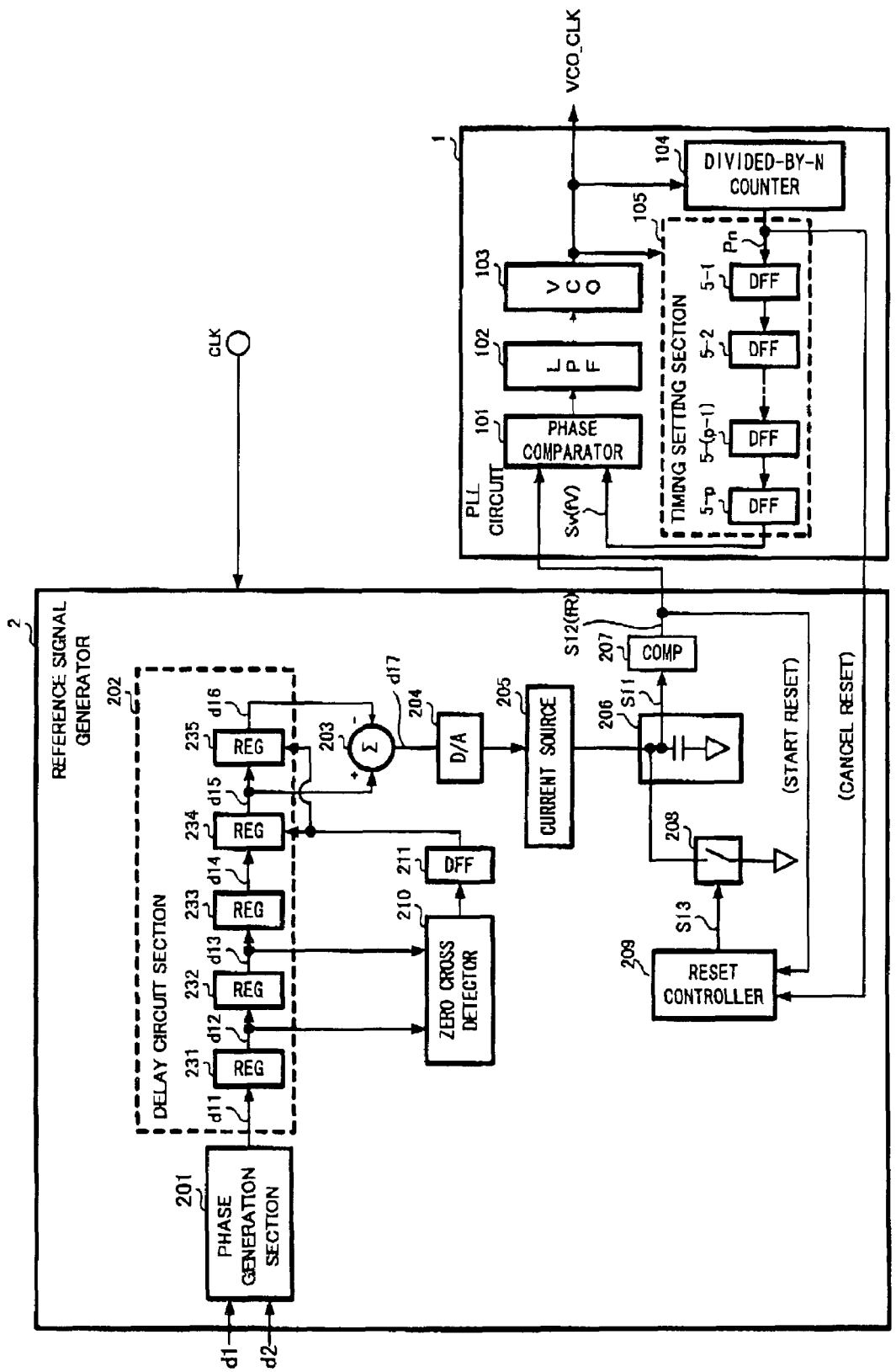
FIG. 7 is a block diagram illustrating the structure of a frequency synthesizer according to a third embodiment of the invention.

As illustrated in FIG. 7, like the frequency synthesizer in the first embodiment, the frequency synthesizer of the embodiment comprises the PLL circuit 1 and the reference signal generator 2.

The PLL circuit 1 generates a synchronization signal whose phase is synchronized with the phase of the reference signal generated by the reference signal generator 2. The PLL circuit 1 comprises the phase comparator 101, the LPF 102, the VCO 103, the frequency divider 104, and a timing setting section 105.

Because the functions and the connection relationship of the individual components of the PLL circuit 1 of the embodiment are basically the same as those of the PLL circuit 1 in the first embodiment, only the differences from the first embodiment will be explained below.

The phase comparator 101 in the embodiment compares the output timing of the reference timing signal S12 output from the reference signal generator 2 with the output timing of a comparison timing signal (delayed signal Sv) output from the timing setting section 105, and generates a phase difference signal which indicates the difference between the output timings of those signals in signal level.

The frequency divider 104 of the embodiment counts the clock VCO_CLK output from the VCO 103, and outputs the pulse signal Pn every time when counting N clocks, thereby frequency-dividing the clock VCO_CLK by a division factor of N. The frequency divider 104 supplies the timing setting section 105 the generated pulse signal Pn. The frequency divider 104 also supplies the reference signal generator 2 the pulse signal Pn as a reset cancellation signal.

The timing setting section 105 sets the reset cancellation signal based on the reference timing signal output from the reference signal generator 2 in such a way that the times of the zero timing and a reset cancellation timing become constant.

The timing setting section 105 delays the pulse signal Pn, and outputs to the phase comparator 101 the delayed signal as the comparison timing signal Sv. The comparison timing signal Sv is output at the zero cross timing, and the period of the pulse signal Pn is determined by the period of the signal S12. Accordingly, based on the reference timing signal, the timing setting section 105 sets the reset cancellation timing earlier than the zero cross timing by a certain period of time.

To be more precise, as illustrated in FIG. 7, the timing setting section 105 includes DFFs 5-1 to 5-p (p is a natural number). The DFFs 5-1 to 5-p sequentially delay and output the pulse signal Pn output from the frequency divider 104, in synchronization with the clock VCO_CLK output from the VCO 103.

The input terminal of the DFF 5-1 is connected to the output terminal of the frequency divider 104, and the input terminals of the DFFs 5-2 to 5-p are sequentially connected to the output terminals of the DFFs 5-1 to 5-(p−1). The output terminal of the DFF 5-p is connected to one input terminal of the phase comparator 101.

When the signal is supplied to the input terminal of each of the DFFs 5-1 to 5-p, each DFF outputs that signal from its output terminal at the timing of the next rise of the clock VCO_CLK.

As mentioned above, because the timing setting section 105 has the DFFs 5-1 to 5-p, it delays the pulse signal Pn by a preset time TX when supplied with the pulse signal Pn from the frequency divider 104. The timing setting section 105 generates the signal Sv as the comparison timing signal for comparing with the output timing of the signal S12 as the reference timing signal, and supplies the phase comparator 101 the generated signal Sv. The number p of the DFFs 5-1 to 5-p is preset based on the time TX and the period $T_{vco}$ of the clock VCO_CLK of the VCO 103.

The reference signal generator 2 of the embodiment operates in synchronization with the supplied system clock CLK, and generates the reference timing signal S12 to be supplied to the PLL circuit 1. The reference signal generator 2 comprises the phase generation section 201, the delay circuit 202, the subtracter 203, the D/A converter 204, the current source 205, the linear interpolation circuit 206, the comparator 207, the reset section 208, a reset controller 209, the zero cross detector 210, and the DFF 211.

Because the functions and the connection relationship of the individual components of the reference signal generator 2 of the embodiment are basically the same as those of the reference signal generator 2 in the first embodiment, only the differences from the first embodiment will be explained below.

The reset section 208 of the embodiment is turned on/off in accordance with an output signal of the reset controller 209 supplied to the control terminal. When the reset section 208 is turned on, the electric charges accumulated in the capacitor of the linear interpolation circuit 206 are discharged, thereby resetting the voltage of the voltage signal S11 to a zero voltage.

The reset controller 209 supplies the control terminal of the reset section 208 a control signal to turn on/off the reset section 208. To be more precise, when the reference timing signal S12 output from the comparator 207 becomes an H level, the reset controller 209 turns on the reset section 208, and resets the voltage of the voltage signal S11 to the zero voltage. When the pulse signal Pn output from the frequency divider 104 of the PLL circuit 1 rises to an H level, the reset controller 209 turns off the reset section 208, and cancels the resetting.

The output signal of the comparator 207 is supplied to the phase comparator 101 of the PLL circuit 1 as the reference timing signal indicating the specific phase of the reference signal.

The RS flip-flop 213 may be provided at the output terminal of the comparator 207 of the embodiment to constitute a mask circuit for preventing the signal level of the signal S12 from becoming an H level even if the signal S11 exceeds the zero voltage other than the adjacent to the zero cross timing as per the first and second embodiments. In this case, the output signal of the RS flip-flop 213 is supplied to the phase comparator 101 of the PLL circuit 1 as the reference signal indicating the specific phase.

Next, with reference to FIGS. 3A to 3J and 8A to 8G, an explanation will be given of the operation of the frequency synthesizer according to the third embodiment structured as described above. FIGS. 8A to 8G are time charts for explaining the difference data d17 output from the subtracter 203, the voltage signal S11 output from the linear interpolation circuit 206, the reference timing signal S12 output from the comparator 207, the reset control signal S13 output from the reset controller 209, the clock signal VCO_CLK output from the VCO 103, the comparison timing signal (pulse signal) Pn output from frequency divider 104, and the comparison timing signal Sv output from timing setting section 105, respectively.

It is supposed that the phase generation section 201 outputs a data string of the phase data d11 as illustrated in FIGS. 3A to 3J to the delay circuit 202 in synchronization with the system clock CLK as per the first embodiment. The symbols "+" and "−" respectively represent the positive and negative polarities of the phase data.

At the time t21, when the register 232 outputs the phase data d13=B_, and the register 231 outputs the phase data d12=C_+, the zero cross detector 210 detects the zero cross timing.

At the time t22, when the system clock CLK rises, the zero cross detector 210 resets the registers 234 and 235 through the DFF 211. When the D/A converter 204 is reset, the phase data d17 becomes zero.

At the time t23, when the system clock CLK rises, the subtracter 203 subtracts the phase data d16=0 output from the register 235 from the phase data d15=B_ output from the register 234, and generates the difference data d17=B_. The subtracter 203 supplies the D/A converter 204 the generated difference data d17. The D/A converter 204 converts the difference data d17=B_ into an analog signal.

Figure 8:
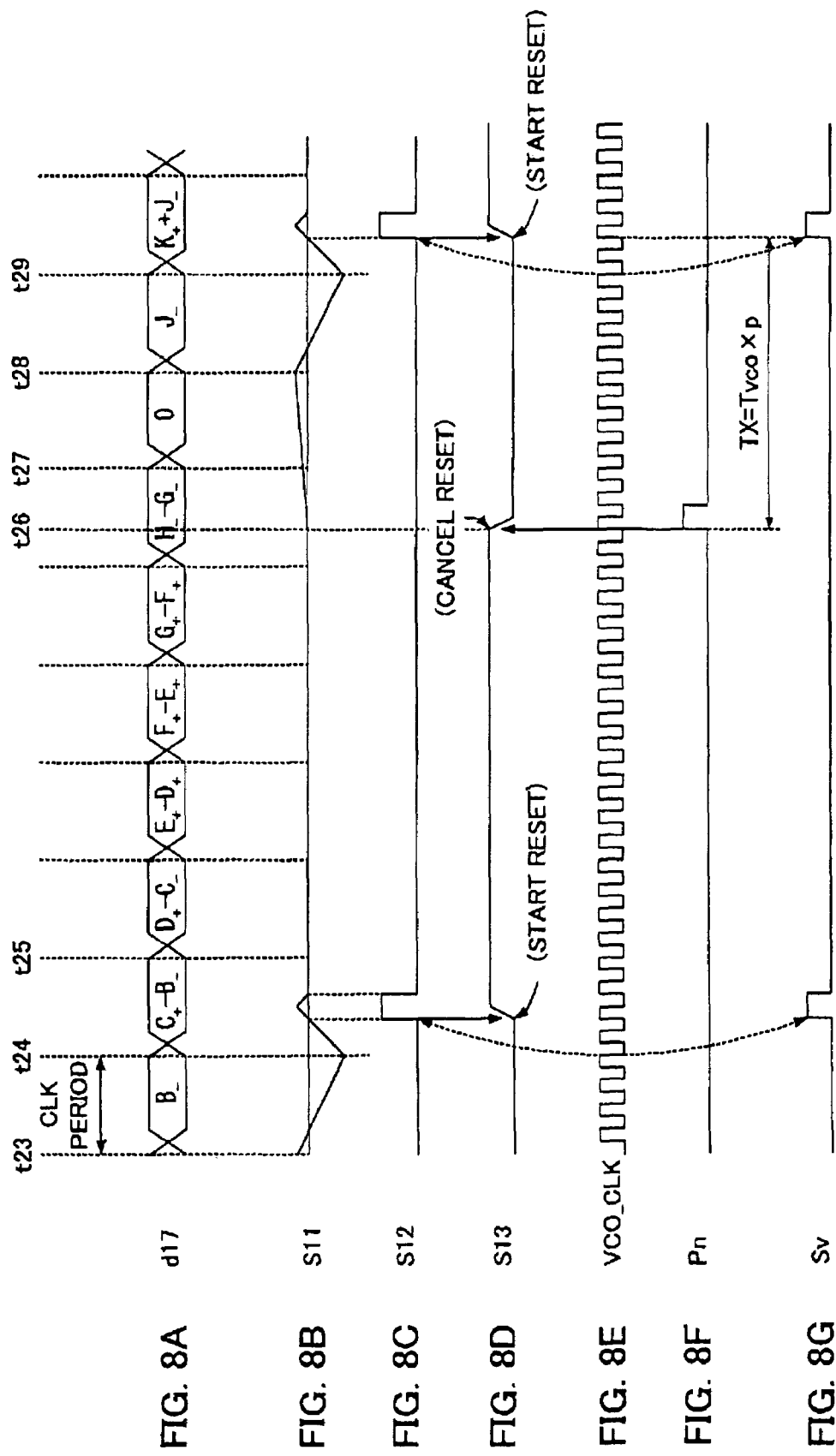
FIGS. 8A to 8G are timing charts for explaining the operation of the frequency synthesizer of the third embodiment in detail.

As illustrated in FIGS. 8A and 8B, the current source 205 supplies the linear interpolation circuit 206 a current with a current value corresponding to that analog signal. Because data B is negative, the voltage of the voltage signal S11 of the linear interpolation circuit 206 drops.

As illustrated in FIGS. 3A to 3J, at the time t24, when the system clock CLK rises, the subtracter 203 subtracts the phase data d16=B_ output from the register 235 from the phase data d15=C_+ output from the register 234, and generates the difference data d17=C_+-B_, and supplies the D/A converter 204 that generated data. The D/A converter 204 converts the difference data d17=C_+-B_ into an analog signal.

As illustrated in FIGS. 8A to 8C, the current source 205 supplies the linear interpolation circuit 206 a current with a current value corresponding to the phase data d17=C_+-B_, and the voltage of the voltage signal S11 increases.

When the voltage of the signal S11 exceeds the zero voltage, the comparator 207 outputs to the phase comparator 101 the H-level reference timing signal S12 as the signal indicating the specific phase of the reference signal. The comparator 207 also outputs the reset controller 209 the H-level reference timing signal S12 as the reset signal.

When supplied with the H-level reference timing signal S12 from the comparator 207, the reset controller 209 outputs an H-level reset control signal S13 to the reset section 208 to turn on the reset section 208 as shown in FIGS. 8C and 8D, and resets the voltage of the voltage signal S11 to the zero voltage. When the voltage of the voltage signal S11 is reset to the zero voltage, the comparator 207 sets the signal level of the reference timing signal S12 at an L level. Therefore, the comparator 207 outputs the pulse-like reference timing signal S12 to the phase comparator 101 as shown in FIG. 8D.

The frequency divider 104 outputs the H-level pulse signal Pn to the reset controller 209 when counting N clocks of the clock VCO_CLK as shown in FIGS. 8E and 8F.

When supplied with the H-level pulse signal Pn from the frequency divider 104, the reset controller 209 supplies the reset section 208 the L-level reset control signal S13 to turn off the reset section 208, and cancels the resetting of the voltage signal S11 as shown in FIGS. 8C, 8D and 8F.

The frequency divider 104 outputs the pulse signal Pn to the timing setting section 105 when counting N clocks of the clock VCO_CLK.

When the time TX=$T_{vco}$×p passes after the pulse signal Pn is supplied, the timing setting section 105 outputs the H-level timing comparison signal Sv to the phase comparator 101 shown in FIGS. 8F and 8G.

The phase comparator 101 compares the rise timing of the reference timing signal S12 output from the comparator 207 shown in FIG. 8C with the rise timing of the timing comparison signal Sv shown in FIG. 8G. After the comparison, the phase comparator 101 outputs to the LPF 102 the phase difference signal which indicates the timing difference between those signals.

If the phase of the reference timing signal S12 is ahead of the phase of the timing comparison signal Sv, the phase comparator 101 outputs to the LPF 102 the phase difference signal which increases a VCO oscillating frequency so as to allow the phase of the timing comparison signal Sv to advance.

If the phase of the timing comparison signal Sv is ahead of the phase of the signal S12, the phase comparator 101 outputs to the LPF 102 the phase difference signal which decreases the VCO oscillating frequency so as to delay the phase of the timing comparison signal Sv. The LPF 102 eliminates high-frequency components higher than the cutoff frequency of the phase difference signal output from the phase comparator 101.

The VCO 103 sets the frequency $f_{out}$ based on the phase difference indicated by the phase difference signal, and outputs the clock VCO_CLK.

When the resetting of the linear interpolation circuit 206 is canceled, as illustrated in FIG. 8D, the signal level of the voltage signal S11 of the linear interpolation circuit 206 gradually rises due to the error of the D/A converter 204 as illustrated in FIG. 8B. When the signal level of the signal S11 rises, the zero cross timing when the D/A converter 204 has an error becomes faster than the normal timing which is the zero cross timing when the D/A converter 204 does not have an error.

The amount of the shift of the zero cross timing from the normal timing, however, becomes constant by canceling the resetting of the voltage signal S11 at a timing before the zero cross timing when the D/A converter 204 has an error by the preset time TX, as shown in FIGS. 8B to 8D and 8F.

Figure 9:
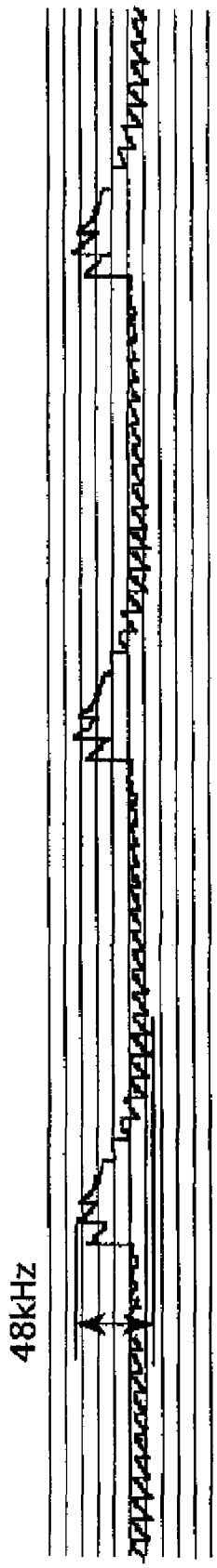
FIG. 9 is a diagram illustrating the result of simulation of a frequency change of the frequency synthesizer according to the third embodiment of the invention.
Figure 13:
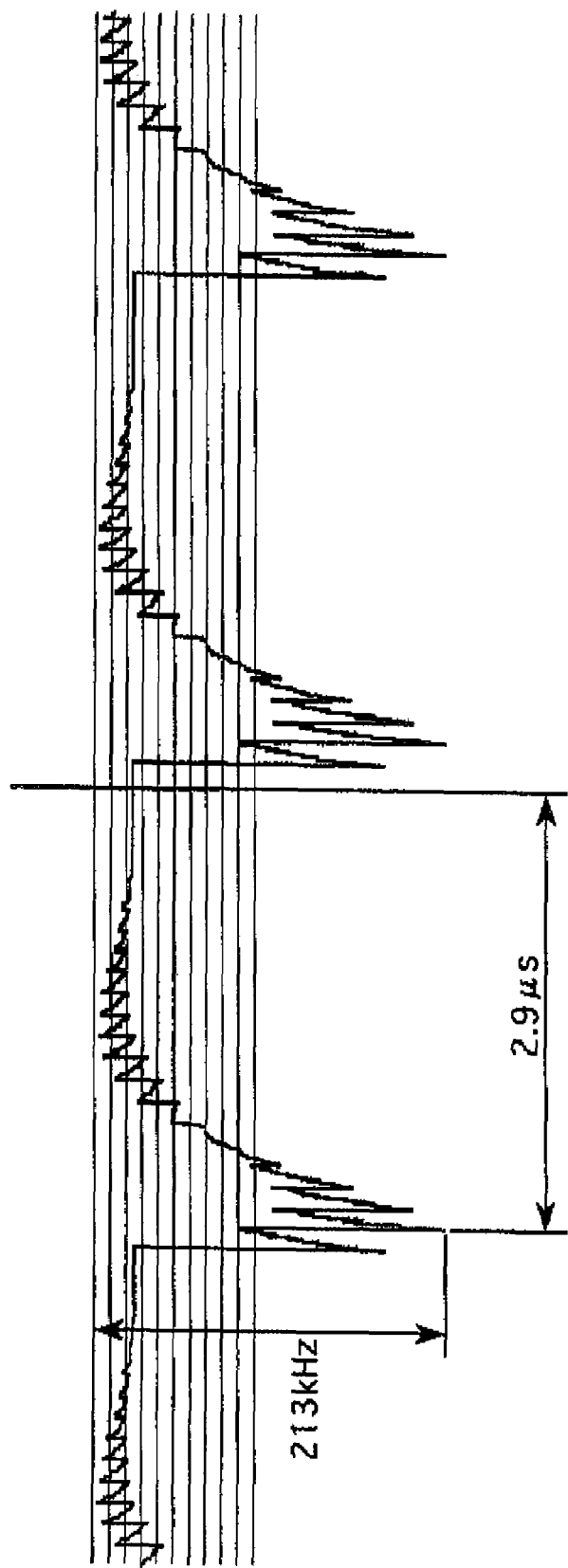
FIG. 13 is a diagram illustrating the result of simulation of frequency change of the conventional liner-interpolation type frequency synthesizer.
Figure 14:
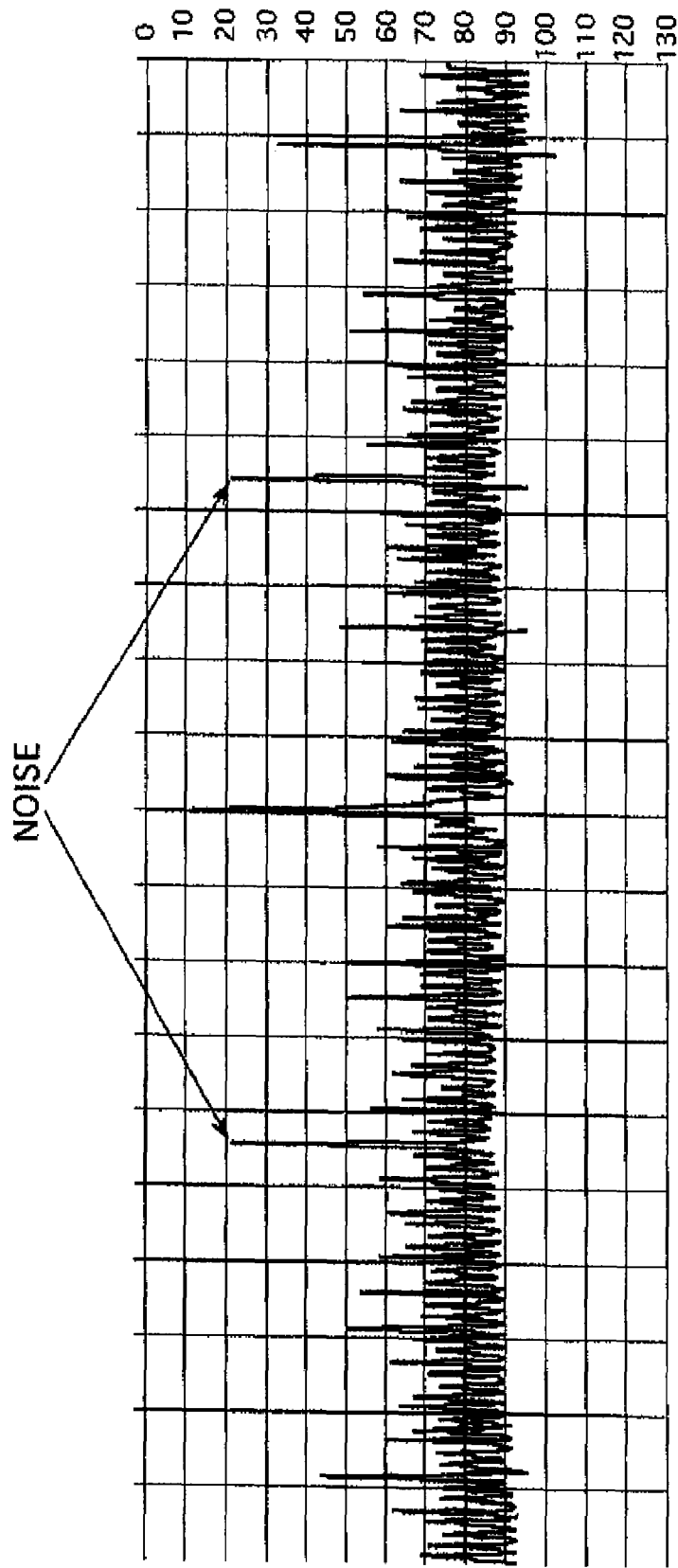
FIG. 14 is a diagram illustrating a simulation result which expresses the frequency change illustrated in FIG. 9 by spectrums.

FIG. 9 illustrates the result of verification of the frequency change characteristic of the frequency synthesizer according to the embodiment by simulation. In contrast, FIG. 13 illustrates the result of verification of the frequency change characteristic of the conventional frequency synthesizer by simulation. The conditions of those simulations are the phase comparison frequency of 8051 kHz, the frequency-divisions of the frequency of the PLL circuit by a division factor of 50, the 0.3% offset error of the D/A converter, and the secondary distortion of 0.3%.

In comparing FIG. 9 with FIG. 13, in the conventional frequency synthesizer, the frequency change is 213 kHz at the maximum at the period of 2.9 μs, while the frequency change in the frequency synthesizer of the embodiment is suppressed to 48 kHz at the maximum.

As explained above, according to this embodiment, the frequency divider 104 outputs to the reset controller 209 the pulse signal Pn for canceling the resetting of the voltage signal S11. The timing setting section 105 delays the pulse signal output from the frequency divider 104 at that time by a predetermined time, and outputs the delayed signal as the timing comparison signal Sv to the phase comparator 101.

Accordingly, the resetting of the voltage signal S11 is cancelled before the zero cross timing by that delayed time, and regardless of the error of the D/A converter 204, the time positions of the reset cancel timing and the zero cross timing can be constant. Therefore, jamming (noise) spectrums are reduced, thereby improving the frequency characteristic.

Figure 10:
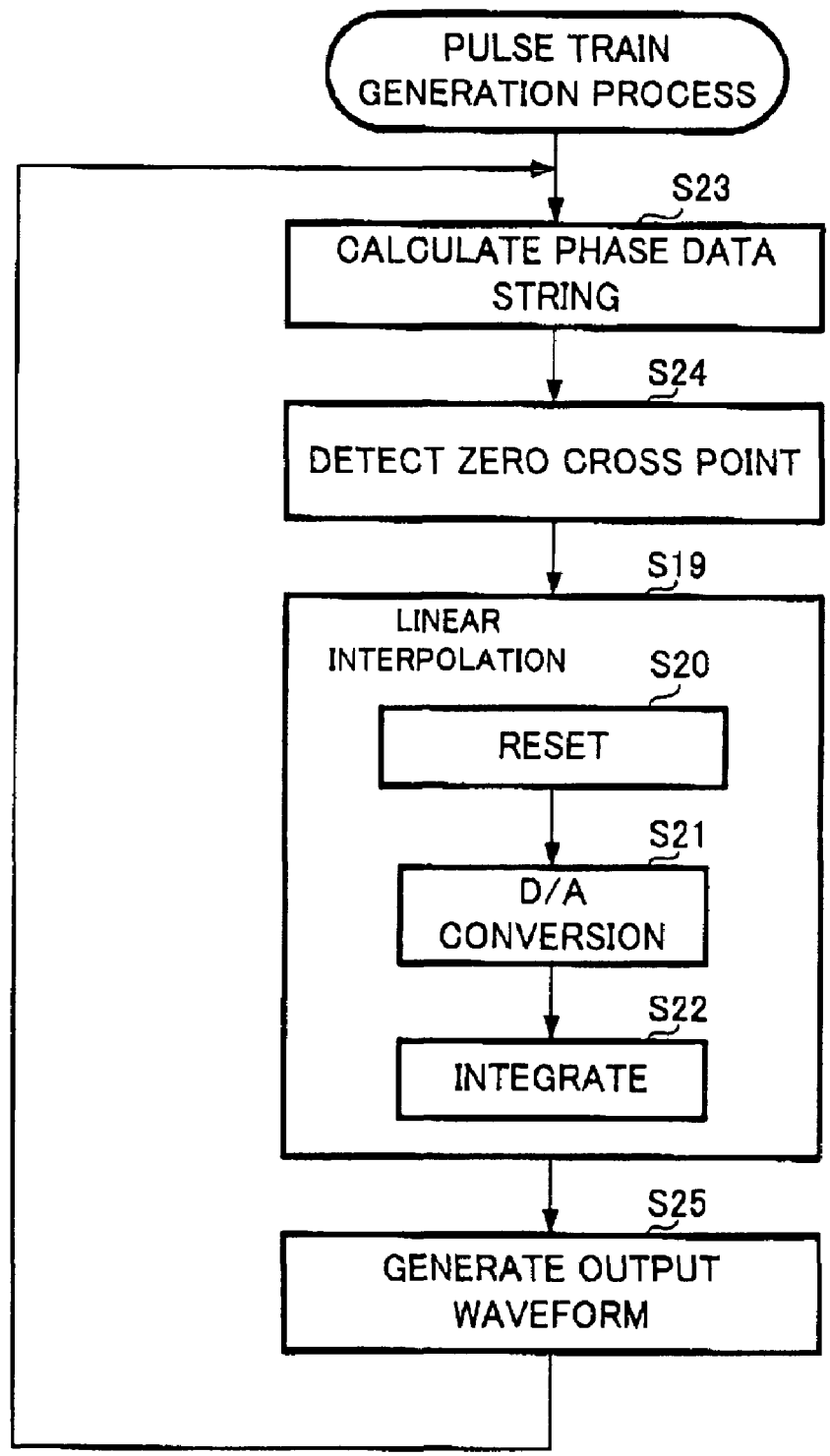
FIG. 10 is a flowchart illustrating a pulse train generation process of a first embodiment of a pulse train generation method according to the invention.
Figure 11:
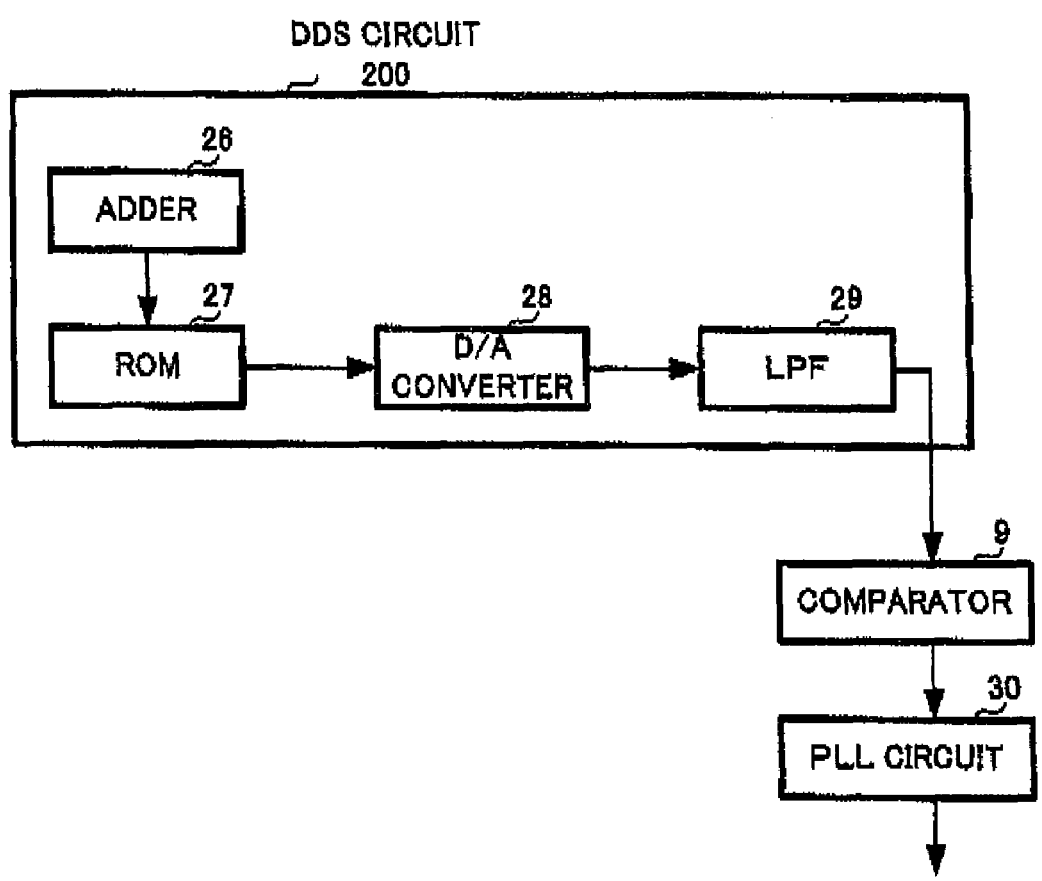
FIG. 11 is a block diagram illustrating the structure of a conventional frequency synthesizer with a DDS.
Figure 12:
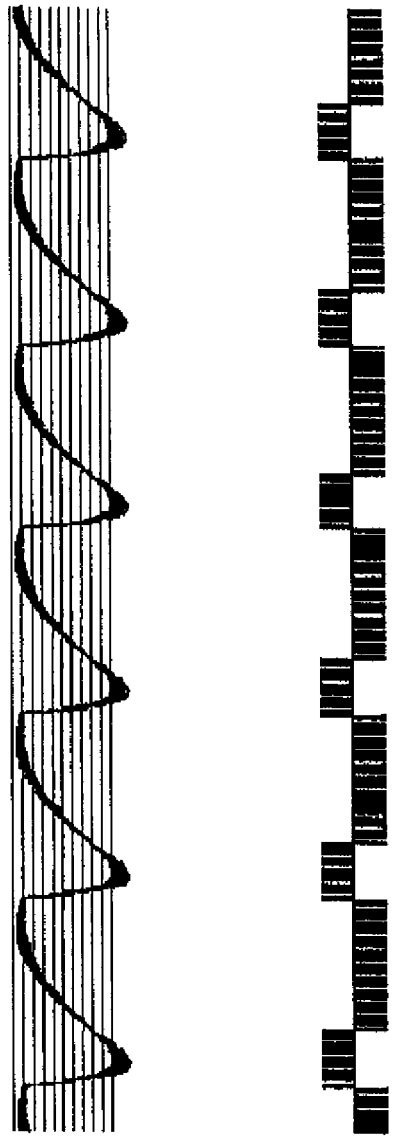
FIGS. 12A and 12B are diagrams for explaining a change in a control voltage of a VCO in a conventional linear-interpolation type frequency synthesizer.

Next, an embodiment of a pulse train generation method of the invention will be explained. FIG. 10 is a flowchart illustrating the procedure of the pulse train generation process of that pulse train generation method.

The pulse train generation process is carried out by, for example, the reference signal generator 2 of the already-described frequency synthesizer and/or by a processor (CPU (Central Processing Unit) or DSP (Digital Signal Processor)) having functions same as those of the reference signal generator 2.

As illustrated in FIG. 10, the pulse train generation process includes a phase calculation step S23 of calculating a phase data string in synchronization with the system clock CLK, a detection step S24 of detecting a zero cross timing of the phase data string calculated by the phase calculation step S23, a linear interpolation step S19, and an output wave generation step S25 of comparing a linear interpolation wave obtained by the linear interpolation step S19 with a voltage of 0 V, and of generating a binary voltage according to the level comparison result.

The linear interpolation step S19 further includes a reset step S20 of discharging electric charges charged in a capacitor, a D/A conversion step S21 of sequentially sampling and holding phase data immediately before the detected zero cross timing and a difference between two pieces of phase data before and after the zero cross timing, and of converting them into an analog value, and an integral step S22 of converting the analog value obtained by the D/A step S21 into a current, and of charging that current to the capacitor.

In the pulse train generation method according to the embodiment, first, at the phase calculation step S23, frequency setting data are cumulatively added in synchronization with a clock generated by a crystal oscillator or the like to calculate the phase data string.

Next, at the detection step S24, the positive or negative sign of the calculated phase data string is checked, and the zero cross timing is detected. In the invention, a point at which the phase data performs zero cross is detected, but a point at which the phase data crosses a predetermined phase value other than zero may be detected.

After the detection of the zero cross timing of the phase data string, the linear interpolation step S19 is carried out. To be more precise, at the reset step S20, the electric charges of the capacitor and the phase data before the zero cross timing are reset.

Next, at the timing of canceling the resetting, phase data A0 immediately before the zero cross timing is sampled and held. The sampled and held phase data A0 is converted into an analog value at the D/A conversion step S21.

At the timing of one clock after the timing of canceling the resetting, a difference A1–A0 between phase data A1 immediately after the zero cross timing and the phase data A0 immediately before the zero cross timing is sampled and held. The sampled and held difference data is converted into an analog value at the D/A conversion step S21.

The analog values obtained at the D/A conversion step S21 are converted into currents, and the currents are charged to the capacitor at the integral step S22. A voltage of a non-grounded terminal of the capacitor is output as the linear interpolation wave.

Next, at the output wave generation step S25, the linear interpolation wave obtained at the linear interpolation step is compared with the voltage of 0 V, and an accurate zero cross timing is determined from the cross point. An output waveform obtained though the output wave generation step S25 becomes an operation waveform which indicates a constant output voltage value with the zero cross timing being a base point, and is supplied to the phase comparator.

The above mentioned steps are performed repeatedly.

Next, another embodiment of a pulse train generation method of the invention will be explained. In this embodiment, a period from the rise of the output wave obtained at the output wave generation step S25 to the cancellation of the resetting is allowed to be constant to suppress the occurrence of a frequency change in output wave due to the shift of the zero cross timing, when a DC offset error occurs at the D/A conversion step S21.

To be more precise, the resetting is started at the time of the rise of the output wave obtained by the output wave generation step S25, and canceled after a certain period of time. At this time, the timing of canceling the resetting is earlier than the reset canceling timing in the first embodiment. Accordingly, there is a slight time from the sampling and holding of the phase data by the D/A converter before the zero cross timing until the point at which the linear interpolation is carried out. In this period, the D/A converter samples and holds 0 data, and a charge current other than an error current originated from the offset error does not flow.

The offset error is generated by a distortion at the time of D/A conversion. An offset current due to the offset error is kept charged by the capacitor, and integrated with time. Accordingly, the shift of the linear interpolation wave increases in proportion to the time from the reset cancel timing. When the time from the reset cancel timing to the zero cross timing changes, the frequency change occurs in the output waveform, and noise spectrums are generated.

Consequently, in the second embodiment of the pulse train generation method of the invention, at the reset step S20, the resetting is carried out for a certain period of time from a timing when the output wave rises (that is, the zero cross timing). Accordingly, the time interval between the zero cross timing and the reset cancel timing is allowed to be constant. As a result, the shift of the zero cross timing due to the offset error does not change and becomes constant, thereby suppressing the frequency change in output wave.

Various embodiments are possible to carry out the invention, which is not limited to the above-described embodiments.

For example, in the above-described embodiments, the cross voltage is explained as the zero voltage. The cross voltage, however, may not be the zero voltage, and may be set to a desired voltage.

Various embodiments and changes may be made thereunto without departing from the broad spirit and scope of the invention. The above-described embodiments are intended to illustrate the present invention, not to limit the scope of the present invention. The scope of the present invention is shown by the attached claims rather than the embodiments. Various modifications made within the meaning of an equivalent of the claims of the invention and within the claims are to be regarded to be in the scope of the present invention.

The present application is based on Japanese Patent Application No. 2004-299382 filed on Sep. 14, 2004, and Japanese Patent Application No. 2004-366712 filed on Dec. 17, 2004, and includes the specifications, claims, drawings and abstracts of those applications. The disclosures of those applications are hereby incorporated in the present application by reference.

What is claimed is:

1. A frequency synthesizer which outputs a synchronization signal synchronized with a reference signal, and comprises:
    a digital/analog converter which sequentially converts difference data of phase data indicating a phase of said reference signal to an analog value;
    a voltage signal generator which integrates said analog value converted by said digital/analog converter, thereby generating a voltage signal interpolating between signal levels corresponding to two time-sequential pieces of said phase data;

a reference-timing-signal output section which outputs a reference timing signal indicating a specific phase of said reference signal at a timing when a signal level of said voltage signal generated by said voltage signal generator crosses a preset setting voltage; and a reset section which resets said voltage signal generated by said voltage signal generator to said preset setting voltage.

2. The frequency synthesizer according to claim 1, further comprising:

a phase comparator which compares an output timing of said reference timing signal output from said reference-timing-signal output section with an output timing of a comparison timing signal generated based on said synchronization signal and outputs a phase difference signal indicating a difference between output timing of said reference timing signal and said output timing of said comparison timing signal in signal level; and a synchronization signal generator which adjusts and sets a frequency based on said signal level of said phase difference signal output from said phase comparator, and generates said synchronization signal with said adjusted and set frequency.

3. The frequency synthesizer according to claim 1, further comprising a detector which detects a cross timing when said phase data changes over said preset setting voltage, wherein said reset section resets said voltage signal upon detection of said cross timing by said detector.

4. The frequency synthesizer according to claim 1, further comprising a reset controller which outputs a reset signal for allowing said reset section to reset said voltage signal only for a predetermined period from said output timing of said reference timing signal based on said reference timing signal, and wherein said reset section resets said voltage signal in response to said reset signal from said reset controller.

5. The frequency synthesizer according to claim 2, further comprising:

a counter section which frequency-divides said synchronization signal by a division factor of N, wherein N is an integer and outputs a frequency division signal;

a timing setting section which delays said frequency division signal by a predetermined time and supplies said delayed signal as said comparison timing signal to said phase comparator; and a reset controller which resets said voltage signal in response to said reference timing signal, and cancels resetting of said voltage signal based on said frequency division signal.

6. A pulse train generation apparatus which generates a pulse train to be a reference timing signal for a PLL circuit, and comprises:

a digital/analog converter which sequentially converts difference data of phase data indicating a phase of said reference timing signal to an analog value;

a voltage signal generator which integrates said analog value converted by said digital/analog converter, thereby generating a voltage signal interpolating between signal levels corresponding to two time-sequential pieces of said phase data;

a reference-timing-signal output section which outputs a reference timing signal indicating a specific phase of said reference timing signal at a timing when a signal level of said voltage signal generated by said voltage signal generator crosses a preset setting voltage; and a reset section which resets said voltage signal generated by said voltage signal generator to said setting voltage.

7. The pulse train generation apparatus according to claim 6, further comprising a reset controller which outputs a reset signal for allowing said reset section to reset said voltage signal only for a predetermined period from said output timing of said reference timing signal, and wherein said reset section resets said voltage signal in response to said reset signal from said reset controller.

8. The pulse train generation apparatus according to claim 6, further comprising a reset controller which resets said voltage signal in response to said reference timing signal output from said reference-timing-signal output section, and cancels resetting of said voltage signal based on a frequency division signal supplied from said PLL circuit.

9. A pulse train generation method of generating a pulse train signal, comprising:

a D/A conversion step produced by a D/A converter for sequentially sampling and holding phase data A0 immediately before a point of prediction that a voltage signal, which interpolates between continuous phase data among a phase data string of a reference signal synchronized with a clock, crosses a preset setting voltage, and a difference A1−A0 between phase data A1 immediately after said point of prediction and said phase data A0 immediately before said point of prediction, and converting a sampled and held value to an analog value;

an integral step produced by voltage signal generator for generating said voltage signal proportional to an integral value obtained by integration of said analog value;

a signal output step produced by a reference-timing-signal output section for outputting a reference timing signal as a pulse train signal indicating a specific phase of said reference signal at a timing when said voltage signal crosses a preset setting voltage; and a reset step produced by a reset section for resetting said voltage signal in such a way that said voltage signal becomes said preset setting voltage after outputting said reference timing signal.

10. The pulse train generation method according to claim 9, further comprising:

a phase calculation step produced by a phase comparator for calculating said phase data string synchronized with said clock;

a detection step produced by said phase comparator for detecting a predicted cross timing based on said phase data string; and a binary signal output step produced by said phase comparator for comparing a signal level of said voltage signal with a signal level of said preset setting voltage and outputting a binary signal for generating said reference timing signal, based on a comparison result.

11. The pulse train generation method according to claim 9, wherein said reset step produced by said reset section cancels resetting of said voltage signal at a timing delayed by a predetermined time from a timing of resetting said voltage signal.

* * * * *